United States Patent

[11] 3,634,149

[72] Inventors Wilhelmus Franciscus Knippenberg; Gerrit Verspui, both of Emmasingel, Netherlands

[21] Appl. No. 678,056
[22] Filed Oct. 25, 1967
[45] Patented Jan. 11, 1972
[73] Assignee U.S. Philips Corporation New York, N.Y.
[32] Priority Oct. 25, 1966
[33] Netherlands
[31] 6615059

[54] METHOD OF MANUFACTURING ALUMINIUM NITRIDE CRYSTALS FOR SEMICONDUCTOR DEVICES
6 Claims, 3 Drawing Figs.

[52] U.S. Cl. .......... 148/175, 23/192, 23/208, 23/294, 23/301, 117/106, 148/1.5, 148/1.6, 148/174, 252/62.3, 317/237
[51] Int. Cl. .......... H01l 7/00, C01b 21/06, B01j 17/28
[50] Field of Search .......... 148/1.5, 174, 175, 171, 1.6; 117/106, 107.2, 200, 201; 23/192, 204, 208, 294, 301; 317/237; 252/62.3

[56] References Cited

UNITED STATES PATENTS

| | | | |
|---|---|---|---|
| 3,210,624 | 10/1965 | Williams | 317/237 |
| 3,224,913 | 12/1965 | Ruehrwein | 148/175 |
| 3,275,415 | 9/1966 | Chang et al. | 23/208 |
| 3,102,828 | 9/1963 | Courvoisier | 117/227 |
| 3,129,125 | 4/1964 | Hamilton | 148/174 |
| 3,228,756 | 1/1966 | Hergenrother | 23/301 |

OTHER REFERENCES

Rabenau, A. " Preparation of Aluminum and Gallium Nitride" Compound Semiconductors Vol. 1 Edited by Willardson, R. K., and Goering, H. L., Reinhold Publishing Corp. N.Y., 1962. Chapter 19, pp. 174- 180.

Brander, R. W. " Epitaxial Growth of Silicon Carbide" J. Electrochemical Soc. Vol. 111, No. 7, 1964 pp. 881- 883.

*Primary Examiner*—Dewayne Rutledge
*Assistant Examiner*—W. G. Saba
*Attorney*—Frank R. Trifari

ABSTRACT: A method of forming aluminum nitride single crystals of large area and silicon carbide-aluminum nitride heterojunctions using a modified Lely method. Aluminum nitride is introduced, as a vapor phase, into a furnace containing a plate-shaped monocrystal of silicon carbide at a temperature between 1800° and 2300° C. At those temperatures, aluminum nitride recrystallizes and condenses to deposit epitaxially on the silicon carbide. If the silicon carbide is of one conductivity type, the aluminum nitride can be suitably doped to be of the opposite conductivity type whereby a heterojunction is formed.

Figure 1:
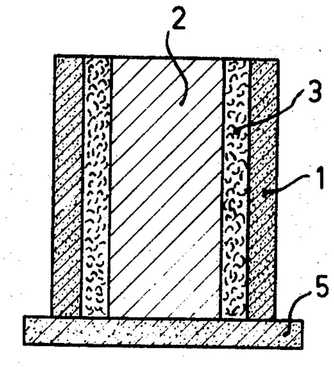

INVENTORS
WILHELMUS F. KNIPPENBERG
GERRIT VERSPUI
BY
AGENT

METHOD OF MANUFACTURING ALUMINIUM NITRIDE CRYSTALS FOR SEMICONDUCTOR DEVICES

It is known that aluminum nitride crystals may be manufactured by recrystallization and/or condensation from the vapor phase at temperatures between 1,800° and 2,300° C. in nitrogen of atmospheric pressure.

However, substantially neddle-shaped crystals are thus obtained and, in certain cases, also plate-shaped crystals of small dimensions, frequently not broader than 0.5 mms.

For uses in the semiconductor technique it is also important, however, to have the disposal of large plate-shaped crystals.

According to the invention such plate-shaped crystals are obtained by depositing aluminum nitride on plate-shaped silicon carbide crystals from the gas phase by recrystallization and/or condensation at temperatures between 1,800° and 2,300° C. Epitaxial growth on the silicon carbide crystals then takes place.

As is well known, plate-shaped silicon carbide crystals may be obtained by recrystallization and/or condensation in an atmosphere of inert gas in a space bounded by silicon carbide at a temperature of approximately 2,500° C. If the occurrence of temperature gradients and gas turbulences is avoided as far as possible, then well-formed, plate-shaped silicon carbide crystals having surface areas up to 1 sq. cm. grow substantially at right angles to the wall of the space.

The conduction properties of such crystals may be adjusted, as is also known, by supplying dopes, for example nitrogen, boron and aluminum, to the gas atmosphere during the crystal growth.

According to the invention it has further been found that, if the aluminum nitride is grown on the silicon carbide crystals while there are still present in the space bounded by silicon carbide in which they have been formed, only epitaxial growth of aluminum nitride takes place at temperatures between 1,800° and 2,100° C., but mixed crystals of aluminum nitride and silicon carbide are formed at temperatures between 2,100° C. and 2,300° C. The composition of such mixed crystals can be controlled by suitable choice of the temperature in the said temperature range at which the content of silicon carbide increases up to 100 percent at 2,300° C., since the aluminum nitride is completely dissociated at this temperature.

The term "aluminum nitride crystals" used in this specification and the claims is to be regarded to include also the said aluminum nitride mixed crystals.

The conduction properties of the aluminum nitride crystals and mixed crystals may be adjusted by supplying dopes, such as sulphur, to the gas atmosphere during the growth.

The resulting combinations of a silicon carbide crystal and an aluminum nitride crystal may advantageously be used as a "hetero-junction" in optoelectrical devices, such as P-N light sources.

Furthermore, these crystal combinations as well as the aluminum nitride crystals themselves, from which the substrate crystal of silicon carbide has been removed, for example, by grinding may be used in the manufacture of semiconductor devices, such as transistors and diodes, especially for use at high temperatures.

In order that the invention may be readily carried into effect it will now be described in detail with reference to a few examples clarified by a drawing.

EXAMPLE 1

As shown in section FIG. 1, a core 2 is placed in a graphite tube 1 and the interspace is filled up with pure silicon carbide 3 obtained by pyrolysis of $SiHCl_2CH_3$ in hydrogen.

The pulverulent silicon carbide is compressed and the core 2 carefully removed, whereupon the whole is sintered.

Figure 2:
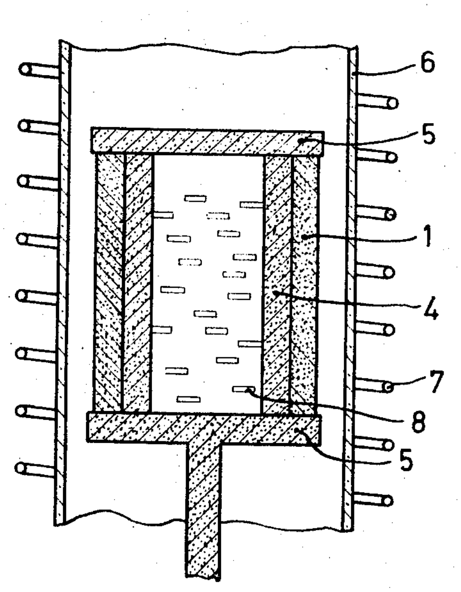

The resulting vessel consisting of the graphite cylinder 1 and the silicon carbide cylinder 4 is closed at both ends by plates 5, as shown in FIG. 2. Subsequently, there is heated to 2,550° C. in a quartz vessel in argon of atmospheric pressure by means of a high frequency coil 7. During this treatment plate-shaped silicon carbide crystals 8 are obtained by recrystallization and/or condensation substantially at right angles to the wall of the cylinder.

These silicon carbide crystals obtained in known manner are used as substrates in forming aluminum nitride crystals. To this end the crystals may be broken off the wall of the cylinder and then be accommodated in a graphite tube for further treatment, for example, by clamping them in grooves provided in the wall of the tube. However, the aluminum nitride is preferably grown on the silicon carbide crystals within the cylinder in which they have been formed.

To this end, the plate 5 at the lower ends of the cylinders 1 and 3 is replaced by a graphite vessel 9 in which an aluminum oxide crucible 10 filled with aluminum 11 is placed.

Figure 3:
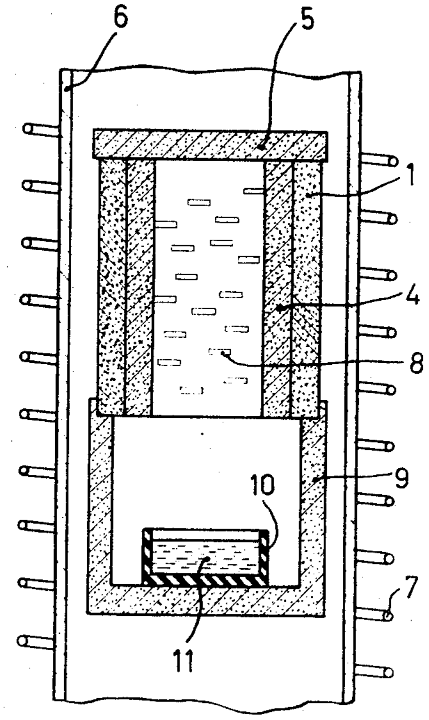

The assembly, which is shown in FIG. 3, is heated in ammonia of atmospheric pressure at 1,400° C. for 2 hours, during which process the aluminum is converted into nitride.

After the atmosphere of ammonia has been replaced by nitrogen the temperature of that section of the apparatus which contains the aluminum nitride is heated to 1,900° C., the temperature of the silicon carbide crystals being raised to 2,000° C. During this process aluminum nitride epitaxially grows on the crystals.

Frequently aluminum nitride deposits on one side of the crystals to a lesser extent or even not at all. If the epitaxial growth is continued for 3 hours, thicknesses between 100$\mu$ and 200$\mu$ are obtained.

Finally the silicon carbide may be removed by grinding, resulting in plate-shaped crystals having surface areas up to 1 sq. cm. which consist only of aluminum nitride.

EXAMPLE 2

In a similar manner as has been described with reference to FIGS. 1, 2 and 3, N-type silicon carbide crystals are formed by recrystallization and/or condensation in an argon atmosphere containing 0.1 percent of nitrogen. P-type aluminum nitride is epitaxially grown on these crystals in a nitrogen atmosphere containing 0.1 percent of hydrogen sulphide.

The resulting crystal combinations are sawn into plates each of 1 sq. mm., which are provided with contacts by applying by fusion a gold alloy containing 5 percent of tantalum at 1,300° C. The resulting diode with heterojunction when loaded by 10 volts 30 m. amps. radiates blue light.

EXAMPLE 3

In a similar manner as has been described in example 1, aluminum nitride is grown on silicon carbide crystals. However, the SiC crystals are maintained at 2,250° C. during the growth. As a result mixed crystals of the composition 90 percent of AlN and 10 percent of SiC epitaxially grow on the SiC crystals.

What is claimed is:

1. A method of growing platelike aluminum nitride monocrystals, comprising providing within a chamber a plate-shaped monocrystal of silicon carbide, heating the silicon carbide monocrystal at a temperature between 1,800° and 2,300° C., introducing into the chamber a gas atmosphere comprising aluminum nitride so as to cause solid aluminum nitride by recrystallization and condensation to vapor deposit and epitaxially grow as a platelike single crystal on the heated silicon carbide monocrystal.

2. A method as set forth in claim 1 wherein the silicon carbide monocrystal is provided by growing in the same chamber by recrystallization and condensation within a space bounded by silicon carbide and at a temperature of approximately 2,500° C.

3. A method as set forth in claim 1 for the growth of aluminum nitride crystals wherein the temperature is between 1,800° and 2,100° C.

4. A method as set forth in claim 1 for the growth of mixed crystals of silicon carbide and aluminum nitride wherein the temperature is between 2,100° and 2,300° C.

5. A method as set forth in claim 1 wherein the gas atmosphere includes an inert gas-containing acceptor or donor impurities for the aluminum nitride.

6. A method as set forth in claim 1 wherein the silicon carbide crystal is separated from the aluminum nitride epitaxial layer.

* * * * *